(12) United States Patent
Maas et al.

(10) Patent No.: US 8,686,481 B2
(45) Date of Patent: Apr. 1, 2014

(54) SEMICONDUCTOR DEVICE WITH AN IMAGE SENSOR AND METHOD FOR THE MANUFACTURING OF SUCH A DEVICE

(75) Inventors: Joris Pieter Valentijn Maas, Eindhoven (NL); Willem-Jan Toren, Saint Maximin de la Sainte (FR); Hein Otto Folkerts, Eindhoven (NL); Willem Hendrik Maes, Lommel (BE); Willem Hoekstra, Valkenswaard (NL); Daniel Wilhelmus Elisabeth Verbugt, Helden (NL); Daniel Hendrik Jan Maria Hermes, Schijndel (NL)

(73) Assignee: Trixell, Moirans (FR)

( * ) Notice: Subject to any disclaimer, the term of this patent is extended or adjusted under 35 U.S.C. 154(b) by 0 days.

(21) Appl. No.: 11/912,697

(22) PCT Filed: Apr. 26, 2006

(86) PCT No.: PCT/IB2006/051301
§ 371 (c)(1),
(2), (4) Date: Oct. 26, 2007

(87) PCT Pub. No.: WO2006/117725
PCT Pub. Date: Nov. 9, 2006

(65) Prior Publication Data
US 2008/0197386 A1      Aug. 21, 2008

(30) Foreign Application Priority Data

Apr. 29, 2005 (EP) .................................. 05103594

(51) Int. Cl.
*H01L 27/146* (2006.01)
(52) U.S. Cl.
CPC ...... *H01L 27/1463* (2013.01); *H01L 27/14603* (2013.01); *H01L 27/14643* (2013.01)
USPC ....................... 257/291; 257/E27.133; 438/73
(58) Field of Classification Search
CPC ................... H01L 21/26586; H01L 21/76224; H01L 21/8238; H01L 27/1463; H01L 27/14603; H01L 27/14609; H01L 27/14643; H01L 27/14681; H01L 27/14689
USPC .............................. 257/291, E27.133; 438/73
See application file for complete search history.

(56) References Cited

U.S. PATENT DOCUMENTS

| | | | |
|---|---|---|---|
| 4,782,036 A * | 11/1988 | Becker et al. ................. 438/561 |
| 5,306,906 A * | 4/1994 | Aoki et al. ................. 250/208.1 |
| 5,401,998 A * | 3/1995 | Chiu et al. .................... 257/368 |
| 5,970,316 A | 10/1999 | Merrill | |
| 5,982,012 A * | 11/1999 | Merrill .......................... 257/463 |

(Continued)

FOREIGN PATENT DOCUMENTS

JP          2003234496 A * 8/2003
WO     WO 2006025079 A1 * 3/2006

*Primary Examiner* — Alexander Sofocleous
*Assistant Examiner* — John P Dulka
(74) *Attorney, Agent, or Firm* — Baker & Hostetler LLP (57) ABSTRACT

Disclosed are embodiments of a semiconductor device comprising a semiconductor body with a semiconductor image sensor comprising a two-dimensional matrix of picture elements, each picture element comprising a radiation-sensitive element coupled to MOS field effect transistors for reading the radiation-sensitive elements, wherein a semiconductor region is sunken in the surface of the body having the same conductivity type as the body and having an increased doping concentration, the semiconductor region being disposed between the radiation-sensitive elements of neighboring picture elements.

5 Claims, 4 Drawing Sheets

(56) References Cited

U.S. PATENT DOCUMENTS

| | | | |
|---|---|---|---|
| 7,205,627 B2* | 4/2007 | Adkisson et al. | 257/463 |
| 7,422,924 B2* | 9/2008 | Rhodes | 438/66 |
| 2003/0038336 A1 | 2/2003 | Mann | |
| 2004/0000681 A1* | 1/2004 | Shinohara et al. | 257/290 |
| 2004/0094784 A1* | 5/2004 | Rhodes et al. | 257/291 |
| 2004/0178430 A1* | 9/2004 | Rhodes et al. | 257/292 |
| 2004/0262646 A1* | 12/2004 | Patrick et al. | 257/233 |
| 2005/0045925 A1* | 3/2005 | Yoshida et al. | 257/291 |
| 2005/0127469 A1* | 6/2005 | Chang et al. | 257/506 |
| 2006/0146156 A1* | 7/2006 | Toros et al. | 348/308 |
| 2007/0045679 A1* | 3/2007 | McKee et al. | 257/291 |
| 2007/0158713 A1* | 7/2007 | Ohkawa | 257/292 |

* cited by examiner

SEMICONDUCTOR DEVICE WITH AN IMAGE SENSOR AND METHOD FOR THE MANUFACTURING OF SUCH A DEVICE

The invention relates to a semiconductor device with a substrate and a semiconductor body with a semiconductor image sensor comprising a two-dimensional matrix of picture elements which include each a radiation-sensitive element coupled to a number of MOS field effect transistors for the benefit of reading the radiation-sensitive elements by selection means for selecting the picture elements, in which each radiation-sensitive element contains a semiconductor region of a first conductivity type in which charge carriers generated by incident radiation are accumulated and in which in the surface of a part of the semiconductor body laterally bordering on the semiconductor region, which part of the semiconductor body is of a second conductivity type opposite to the first conductivity type, an isolation region is sunk for separating neighboring picture elements and in which in the part of the semiconductor body of the second conductivity type underneath the isolation region a further semiconductor region of the second conductivity type is formed, having an increased doping concentration. Such a device is also called MOS image sensor and in practice usually called CMOS image sensor. Such a device can be manufactured in a relatively cost-effective manner and is attractive to many applications, more particularly for applications in the field of consumer electronics. The invention also relates to a method for the manufacture of such a device.

Such a device and method are known from patent specification US 2004/0094784 A1 published on May 20, 2004 under this number. It describes a CMOS image sensor having a pn-diode in a pnp-structure as a radiation-sensitive element. Moreover, each picture element has a number of MOS transistors for reading the picture elements while use is made of selection means. An n-type semiconductor region buried in the semiconductor body then operates as a charge accumulating region. In an adjacent (p-type) part of the semiconductor body there is an isolation region that is sunken relative to the surface of the semiconductor body and has the form of a what is called STI (Shallow Trench Isolation) region. Underneath is formed in the semiconductor body a buried p-type region having a higher doping concentration than that of the surrounding part of the (p-type) semiconductor body. Because of this region the leakage current is reduced and the capacitance of the radiation-sensitive element is increased because it functions as a barrier for charge carriers i.e. electrons in the buried n-type semiconductor region.

A disadvantage of the known device is that the leakage current of the device is still relatively high and that the radiation sensitivity needs further improvement.

It is therefore an object of the present invention to provide a device and method which result in an improved leakage current and are extremely radiation-sensitive.

For this purpose a device of the type defined in the opening paragraph and in accordance with the invention is characterized in that the further semiconductor region is sunk in the surface of the semiconductor body and is wider than the isolation region. The invention is first and foremost based on the recognition that also the sides of the isolation regions contribute to an increase of the leakage current as a result of defects present there and that by sinking the further semiconductor region into the semiconductor body from the surface down and making it wider than the isolation region, the effect of the defects increasing the leakage current is reduced and hence the leakage current is reduced. The invention is further based on the recognition that a further designing and positioning of the further semiconductor region is possible without the need for additional process steps and there the desired object can be easily achieved by the use of an adapted mask, i.e. a mask having larger openings when the further semiconductor region is to be introduced, for example by means of ion implantation. Finally, the invention is based on the unanticipated recognition that with a device like this an increase of the radiation sensitivity is possible in a simple manner. Since the further semiconductor region, or rather a similar semiconductor region, can now provide the mutual separation of two neighboring picture elements also at a number of places, the use of an isolation region can be dispensed with at these places. This renders possible a smaller surface to be covered by the isolation function, so that the radiation-sensitive surface can be enlarged.

In a preferred embodiment of a semiconductor device according to the invention the isolation region is exclusively situated between two neighboring picture elements there where a radiation-sensitive element of one picture element borders on the MOS transistors of the other picture element, and there where two neighboring picture elements with their radiation-sensitive elements border on each other is found another semiconductor region of the second conductivity type having an increased doping concentration and being sunk in the surface of the part of the semiconductor body. Since now—generally in one direction of the matrix—the isolation region is left out, the surface of the radiation-sensitive element can be enlarged. For a picture element having a dimension of $3.5 \times 3.5\, \mu m^2$, said surface may be about 20% larger. An additional advantage is that the total length of the, for example STI isolation around a picture element can be smaller than that which results from an additional reduction of the leakage current.

With a periodical structure of the matrix of the image sensor the isolation region in one direction of the matrix may generally be left out or replaced with the other semiconductor region. In practice, where the radiation-sensitive element of the transistors belonging to a picture element is separated by a what is called transfer gate electrode, this will be the physical/geometrical longitudinal direction of this transfer gate eletrode, which direction is usually referred to as X-direction if the MOS image sensor is referred to as an XY MOS image sensor. In the other direction, i.e. the Y direction, in which the MOS transistors of the one picture element border on the radiation-sensitive element of a neighboring picture element, a sunken isolation region surrounded by the further semiconductor region is advantageously present.

In a number of cases it is possible that in both directions the sunken isolation regions are at least partly absent. If, for example, every third X-row of the matrix there is a reflection of the picture element orientation, where at the location of that reflection also in the Y direction two neighboring picture elements bound on each other with their radiation-sensitive elements, also at the location of that reflection, an isolation region may be left out in the Y direction and the separation of the picture elements may take place by the other semiconductor region formed there as well. Another case is the what is called shared concept case. The MOS transistors are then not present for each picture element, but they are used by a (small) number of neighboring picture elements, for example for a 2×2 picture element sub-matrix. In that case an isolation region may be left out and replaced with the other semiconductor region around, at any rate on three sides of, this sub-matrix and between the picture elements of the sub-matrix.

In an advantageous embodiment the further semiconductor region and the other semiconductor region are formed simultaneously. This renders its manufacture simple. Only a single masking step is needed.

Preferably, the further semiconductor region and the other semiconductor region are formed by means of a well-forming step from a CMOS process. Thus a standard process can be implemented. A modern CMOS process is of the what is called twin-tub type, in which both an n-type and p-type well is formed in the semiconductor body. Depending on the fact whether the sensor has an n-type semiconductor region or a p-type semiconductor region for the accumulation of electrons and holes respectively, the p-well and the n-well step respectively can be used for this purpose. For further peripheral circuitry are preferably used both NMOS and PMOS transistors which are both available in a CMOS process.

Although also a LOCOS (Local Oxidation Of Silicon) may have been used for the isolation region, the isolation region preferably comprises a what is called shallow groove isolation. Various advantages such as compactness and planarity are linked with this. Preferably the first conductivity type is the n-conductivity type.

A method for the manufacture of a semiconductor device comprising a substrate and a semiconductor body with a semiconductor image sensor having a two-dimensional matrix of picture elements which comprise each a radiation-sensitive element coupled to a number of MOS field effect transistors for reading out the radiation-sensitive elements via selection means for selecting the picture elements, each radiation-sensitive element comprising a semiconductor region of a first conductivity type in which charge carriers generated by incident radiation are accumulated and in which an isolation region for separating neighboring picture elements is sunk in the surface of a part of the semiconductor body, which part laterally borders on the semiconductor region and is of a second conductivity type opposite to the first conductivity type and in which in the part of the semiconductor body of the second conductivity type underneath the isolation region a further semiconductor region of the second conductivity type is formed, having an increased doping concentration, which method is characterized according to the invention in that the further semiconductor region is sunk in the surface of the semiconductor body and is made wider than the isolation region. In this way a device according to the invention is obtained in a simple manner.

In a preferred embodiment of a method according to the invention the isolation region is formed only there where between two neighboring picture elements a radiation-sensitive element of one picture element borders on the MOS transistors of the other picture element and there where two neighboring picture elements are adjacent to each other with their radiation-sensitive elements another semiconductor region of the second conductivity type sunk in the surface of the part of the semiconductor body and having an increased doping concentration is formed. Preferably, the further semiconductor region and the other semiconductor region are formed simultaneously. The forming is preferably effected in a well-forming step from a CMOS process.

The invention will now be further explained with reference to several examples of embodiment and the drawing, in which.

The Figures are not drawn to scale and some dimensions are shown in exaggerated form for clarity's sake. Corresponding regions or parts have as much as possible the same shading and the same reference character.

Figure 1:
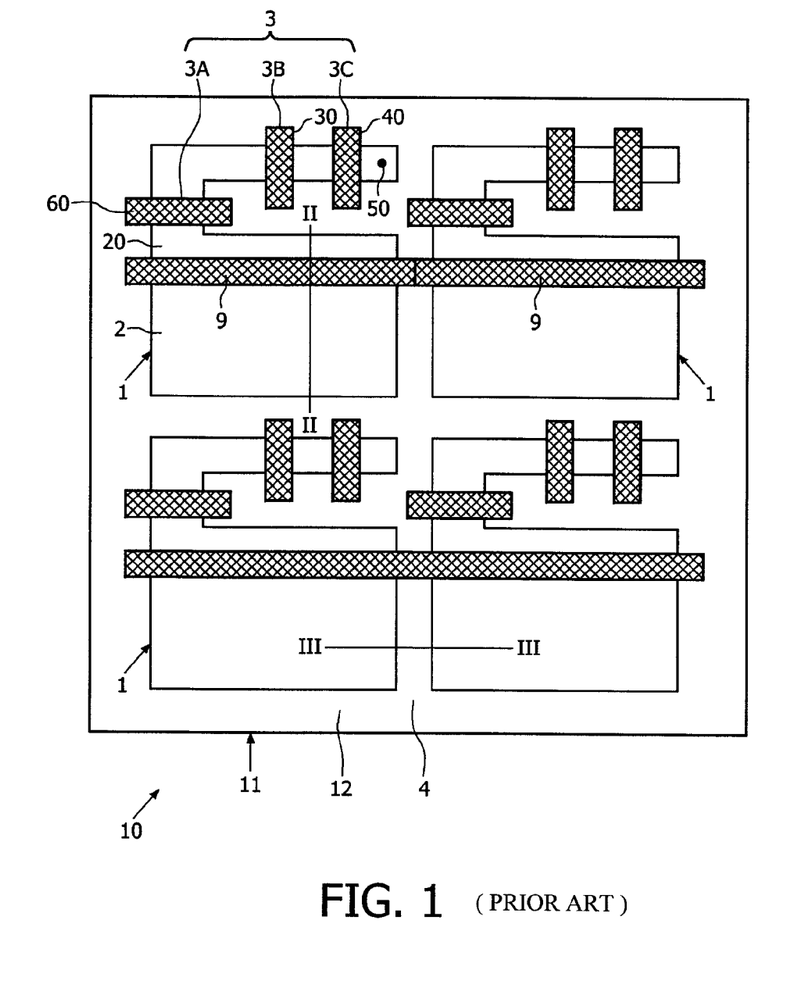
FIG. 1 shows schematically and in plan view a known semiconductor device with an image sensor.
Figure 2:
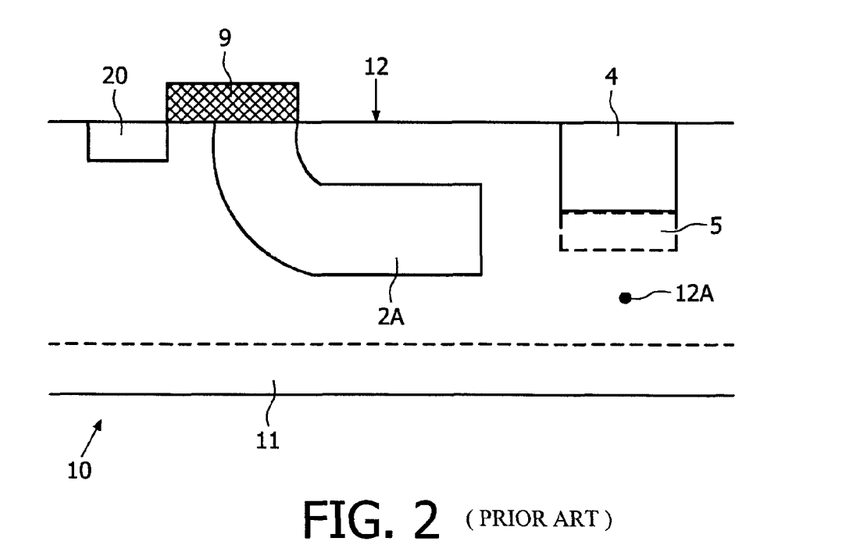
FIGS. 2 and 3 show schematically and in cross section perpendicular to the thickness direction the device of FIG. 1 along the lines II-II and III-III respectively.
Figure 3:
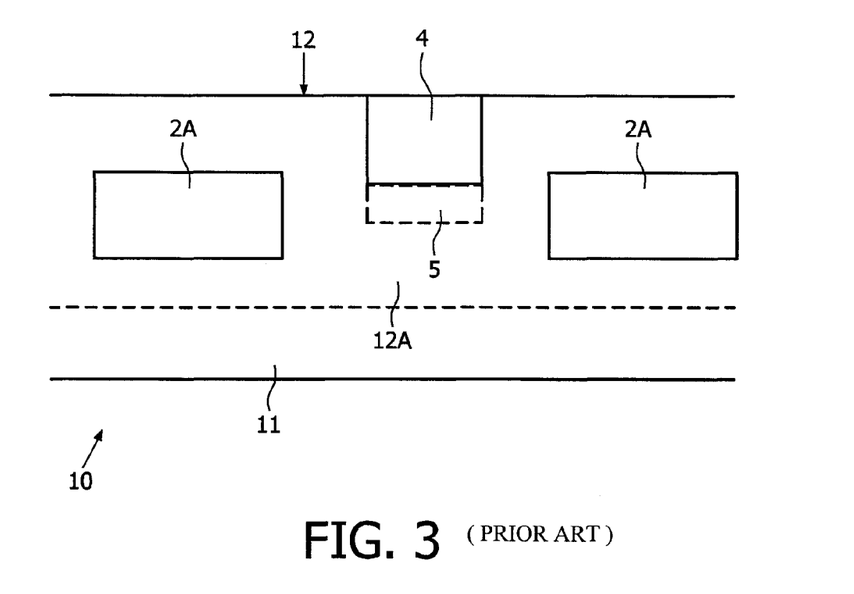

FIG. 1 shows schematically and in plan view a known semiconductor device with an image sensor. FIGS. 2 and 3 show schematically and in cross section perpendicular to the thickness direction the device of FIG. 1 along the lines II-II and III-III respectively. The device 10 comprises for example (see FIG. 2) a substrate 11 and a semiconductor body 12 in which an image sensor is formed with a pixel matrix 1. The substrate and semiconductor body comprise a radiation-sensitive element 2 in which charge carriers generated by incident radiation are stored and transferred to a floating diffusion region 20 by means of a transfer electrode 9. The floating diffusion region 20 is coupled to a gate electrode 30 of a source-follower transistor 3B. The source-follower transistor 3B supplies an output signal to a row selection access transistor 3C with a gate electrode 40 for selectively gating the output signal to a connection 50. A reset transistor 3A with a gate electrode 60 serves to reset the floating diffusion region 20 to a certain charge level before charge is constantly transferred from the radiation-sensitive element 2.

The radiation-sensitive element 2 comprises (FIG. 2) an n-type semiconductor region 2A formed in a p-type region 12A of the semiconductor body 12, which n-type semiconductor region 2A runs as far as the transfer electrode 9 separated from the surface by a dielectric layer (not shown in the drawing). Thus the radiation-sensitive element 2 comprises a pnp structure and a what is called pinned photo diode. In the surface of the semiconductor body 12 (see FIG. 2 and FIG. 3) a sunken isolation region 4 is formed in the shape of a what is called shallow groove isolation surrounding the picture elements 1 (see FIG. 1). Underneath the isolation region 4 a buried further semiconductor region 5 is formed leading to a reduction of the leakage current of the device 10 and leading to an increase of the charge storage capacity of a radiation-sensitive element 2. This buried region 5 contains a higher (p-type) doping concentration than the surrounding p-type region 12A of the semiconductor body 12.

Figure 4:
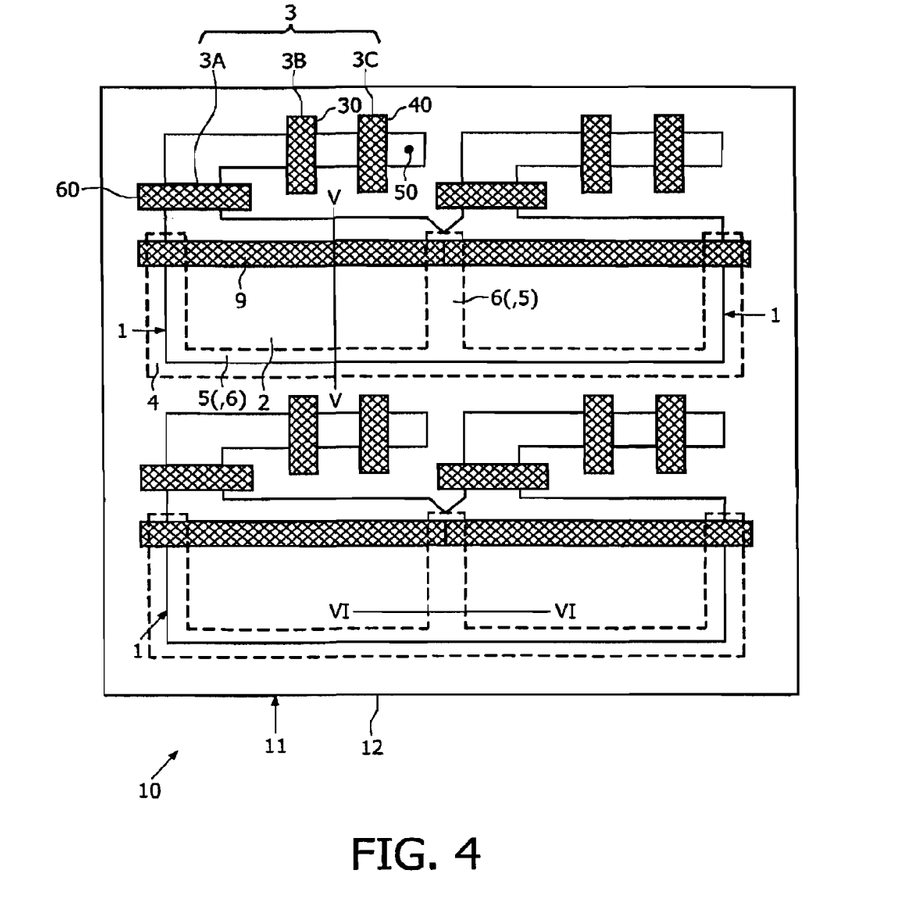
FIG. 4 shows schematically and in plan view a semiconductor device with an image sensor according to the invention.
Figure 5:
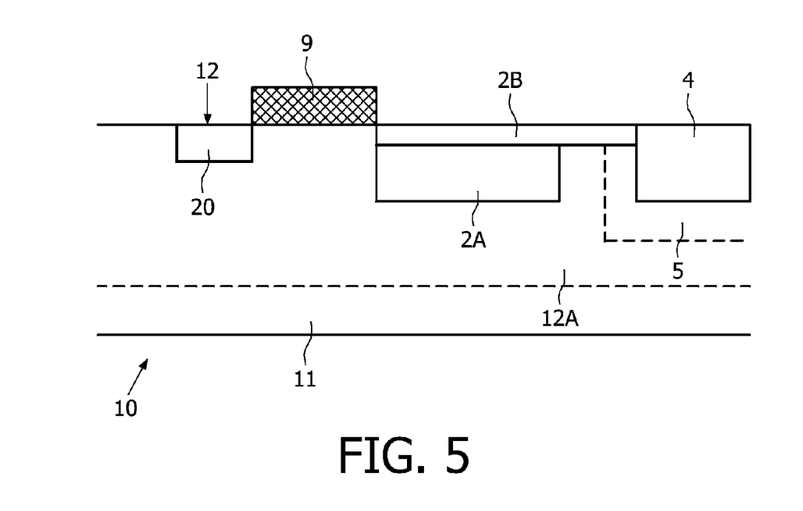
FIGS. 5 and 6 show schematically and in cross section perpendicular to the thickness direction the device of FIG. 4 along the lines V-V and VI-VI respectively.
Figure 6:
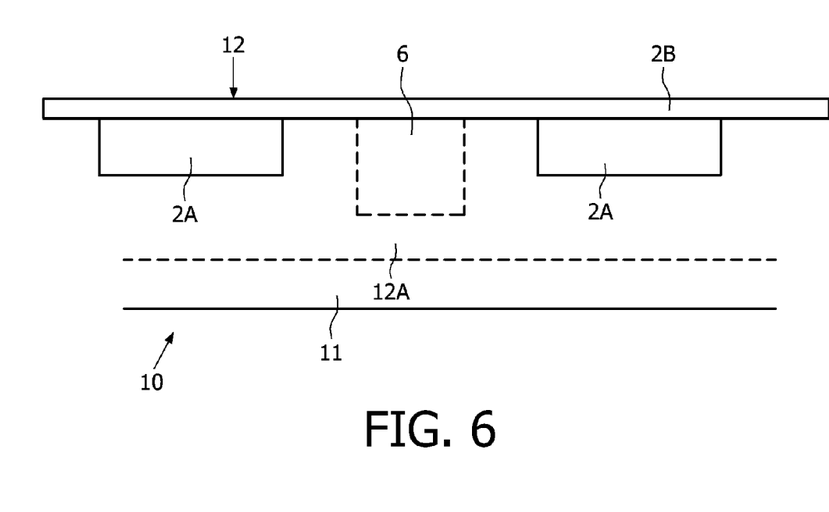

FIG. 4 shows schematically and in plan view a semiconductor device comprising an image sensor in accordance with the invention, and FIGS. 5 and 6 show schematically and in cross section perpendicular to the thickness direction the device of FIG. 4 along the lines V-V and VI-VI. The main difference of the known device is formed by the positioning of the isolation region 4. At places where a picture element 1 (see FIG. 4) borders on an adjacent picture element 1 at the location of the radiation-sensitive elements 2 of these picture elements, the isolation region 4 is lacking (see also FIG. 6). At places where the transistors 3 of a picture element 1 border on the radiation-sensitive element 2 of an adjacent picture element (see also FIG. 5), the isolation region 4 is present, it is true, but there the further semiconductor region 5 is not a buried region like in the known device, but a region sunk in the surface of the semiconductor body 12 and, what is more, the width of the further semiconductor region 5 is larger than the width of the isolation region. This considerably improves the operation of the further semiconductor region 5, which results in a further reduction of the leakage current of the device 10 in accordance with the invention and a further increase of the charge storage capacity of the radiation-sensitive elements 2 of the device 10 in accordance with the invention.

In this example the doping concentration of the semiconductor region 2A is about $10^{17}$ at/cm³. The doping concentration of the part 12A of the semiconductor body 12 is about $10^{15}$ at/cm³. The doping concentration of the semiconductor region 2B is about $10^{10}$ at/cm³ and the doping concentration of the further semiconductor region 5 is about $10^{17}$ at/cm³.

In lieu of the isolation region 4 there is another semiconductor region 6 between two adjacent radiation-sensitive elements 2 of two neighboring picture elements (see FIG. 6), which other semiconductor region 6, just like the adjacent part 12A of the semiconductor body 12, is of the p-type, but has a higher doping concentration. By the lack of the isolation region at this spot (these kinds of spots) the radiation-sensitive element 2 of the picture element 1 can be provided with a larger surface, for example for a pixel having a dimension of 3.5 μm this surface area can become 20% larger. This causes the sensitivity and the charge storage capacity of a pixel 1 to increase. The other semiconductor region 6 here provides an adequate separation between two neighboring picture elements 1. The doping concentration of the other semiconductor region 6 is about $10^{17}$ at/cm³ in this example.

In this example the further semiconductor region 5 and the other semiconductor region 6 are formed simultaneously, in this case by means of ion implantation with a suitable mask. A well-forming step is selected from a what is called twin-tub CMOS process for the formation of these regions 5,6. In this step, which forms part of the CMOS process, further transistors are formed outside the region of the image sensor in the semiconductor body 12, which further transistors are not shown in the drawing and are both of the NMOST and the PMOST type. They form for example a circuit which provides driving and/or reading electronics. In an advantageous variant they (also) form part of a circuit for the purpose of image processing and/or image manipulation.

The pinned photodiode, which forms part of the radiation-sensitive element 2, is formed here between the buried n-type region 2A and a p-type region 2B sunken in the surface.

Manufacturing a device in accordance with the invention may be characterized with respect to the known method in the following manner. With the formation of the further semiconductor region 5, for example an implantation mask is used, which is wider than the isolation region 4 and is aligned to it. The implantation energy(ies) and the associated doses are then selected such that the further semiconductor region 5 forms a region sunken in the surface. At the same time the mask is chosen such that the other semiconductor region 6 is formed simultaneously.

The invention is not restricted to the examples of embodiment given since within the scope of the invention many variations and modifications are possible for a man of skill in the art. For example, apart from CMOS also a Bi(C)MOS (Bipolar (Complementary) Metal Oxide Semiconductor) IC (Integrated Circuit) may be applied. In lieu of a radiation-sensitive element with an npn-structure, it is also possible for a radiation-sensitive element with a pnp-structure to be applied. Further it is observed that in lieu of the STI isolation regions also isolation regions obtained from the application of LOCOS (Local Oxidation Of Silicon) technology can be applied.

It is expressly stated that a radiation-sensitive element may not only be formed by a what is called pinned diode, but also differently, such as by a single non-pinned) photodiode, in which the semiconductor region forms not more than a single pn-junction, for example with a semiconductor region of the opposite conductivity type positioned above it and bordering on the surface.

The invention claimed is:

1. A semiconductor device comprising:
   a semiconductor body with a semiconductor image sensor that comprises a two-dimensional matrix of picture elements arranged in a horizontal direction and a vertical direction, each of the two-dimensional matrix of picture elements comprises a radiation-sensitive element coupled to a plurality of MOS field effect transistors for reading the radiation-sensitive element to an output signal connection, wherein there is one radiation-sensitive element per the output signal connection, wherein each of the two-dimensional matrix of picture elements has same orientation in the two-dimensional matrix;
   a first semiconductor region that is sunken in a surface of the semiconductor body and is disposed at least partially below a trench isolation region, wherein the first semiconductor region has same conductivity type as the semiconductor body and an increased doping concentration than the semiconductor body, wherein along the vertical direction of the two dimensional matrix of picture elements, the radiation-sensitive element of a picture element borders the MOS field effect transistor of a neighboring picture element with the first semiconductor region, wherein the trench isolation region is exclusively disposed between adjacent radiation-sensitive elements of the neighboring picture elements and is surrounded by the first semiconductor region; and
   a second semiconductor region that is sunken in a surface of the semiconductor body and is disposed between the radiation-sensitive element of a picture element and the radiation-sensitive element of neighboring picture element along the horizontal direction of the two-dimensional matrix of picture elements, wherein the second semiconductor region has same conductivity type as the semiconductor body and an increased doping concentration than the semiconductor body.

2. The semiconductor device of claim 1, further comprising additional NMOS and PMOS transistors, located beyond the semiconductor image sensor.

3. The semiconductor device of claim 1, wherein the semiconductor body is p-type and each radiation-sensitive element contains an n-type semiconductor region in which charge carries generated by incident radiation are accumulated.

4. A method for making a semiconductor device comprising a semiconductor body with a semiconductor image sensor comprising a two-dimensional matrix of picture elements arranged in a horizontal direction and a vertical direction, each of the two-dimensional matrix of picture elements comprises a radiation-sensitive element coupled to MOS field effect transistors for reading the radiation-sensitive element to an output signal connection, wherein there is one radiation-sensitive element per the output signal connection, wherein each of the two-dimensional matrix of picture elements has same orientation in the two-dimensional matrix, the method comprising:
   a) providing the semiconductor body;
   b) forming a set of first semiconductor regions sunken in a surface of the semiconductor body and is disposed at least partially below a trench isolation region, wherein the first semiconductor region has same conductivity type as the semiconductor body and an increased doping concentration than the semiconductor body, wherein along the vertical direction of the two dimensional matrix of picture elements, the radiation-sensitive element of a picture element borders the MOS field effect transistor of a neighboring picture element with each of the first semiconductor regions, wherein the trench isolation region is exclusively disposed between adjacent radiation-sensitive elements of the neighboring picture elements and is surrounded by the first semiconductor region; and c) forming a second set of semiconductor regions that is sunken in a surface of the semiconductor body and is disposed between the radiation-sensitive element of a picture element and the radiation-sensitive element of a neighboring picture element along the horizontal direction of the two-dimensional matrix of picture elements, wherein the second semiconductor region has same conductivity type as the semiconductor body and an increased doping concentration than the semiconductor body.

5. The method of claim 4, wherein the semiconductor body is p-type and each radiation-sensitive element contains an n-type semiconductor region in which charge carriers generated by incident radiation are accumulated.

\* \* \* \* \*

UNITED STATES PATENT AND TRADEMARK OFFICE
CERTIFICATE OF CORRECTION

| | |
|---|---|
| PATENT NO. | : 8,686,481 B2 |
| APPLICATION NO. | : 11/912697 |
| DATED | : April 1, 2014 |
| INVENTOR(S) | : Joris Pieter Valentijn Maas et al. |

It is certified that error appears in the above-identified patent and that said Letters Patent is hereby corrected as shown below:

On the Title Page, Item (54) and in the Specification, Column 1, Line 3, "Title"

Please replace "MANUFACTURING" with --MANUFACTURE--

Signed and Sealed this
Eighth Day of July, 2014

Michelle K. Lee
*Deputy Director of the United States Patent and Trademark Office*